(12) United States Patent
Ohta

(10) Patent No.: US 11,450,803 B2
(45) Date of Patent: Sep. 20, 2022

(54) RESISTANCE CHANGE ELEMENT AND METHOD OF MANUFACTURING SUCH

(71) Applicant: TDK Corporation, Tokyo (JP)

(72) Inventor: Naoki Ohta, Tokyo (JP)

(73) Assignee: TDK Corporation, Tokyo (JP)

(*) Notice: Subject to any disclaimer, the term of this patent is extended or adjusted under 35 U.S.C. 154(b) by 113 days.

(21) Appl. No.: 16/735,909

(22) Filed: Jan. 7, 2020

(65) Prior Publication Data
US 2020/0279997 A1 Sep. 3, 2020

(30) Foreign Application Priority Data

Mar. 1, 2019 (JP) .............................. JP2019-037270

(51) Int. Cl.
*H01L 45/00* (2006.01)
(52) U.S. Cl.
CPC ........ *H01L 45/1253* (2013.01); *H01L 45/128* (2013.01); *H01L 45/16* (2013.01)
(58) Field of Classification Search
CPC ............................ H01L 43/08; H01L 45/1253
See application file for complete search history.

(56) References Cited

U.S. PATENT DOCUMENTS

2003/0039080 A1* 2/2003 Kagami ................. B82Y 25/00
2013/0037777 A1 2/2013 Mikawa et al.

FOREIGN PATENT DOCUMENTS

| JP | 2002-305336 A | 10/2002 |
| JP | 2006-080259 A | 3/2006 |
| WO | 2011/132423 A1 | 10/2011 |

* cited by examiner

*Primary Examiner* — Moazzam Hossain
*Assistant Examiner* — Hajar Kolahdouzan
(74) *Attorney, Agent, or Firm* — Posz Law Group, PLC

(57) ABSTRACT

A resistance change element includes a first lead electrode, a resistance change layer provided on the first lead electrode, and a second lead electrode provided on the resistance change layer. The surface of the first lead electrode on the resistance change layer side includes a first region in which the resistance change layer is provided, and a second region that is a region other than the first region. In the second region, a second material having a work function that is larger than that of a first material configuring the first lead electrode is unevenly distributed.

12 Claims, 4 Drawing Sheets

RESISTANCE CHANGE ELEMENT AND METHOD OF MANUFACTURING SUCH

CROSS REFERENCE TO RELATED APPLICATIONS

The present application is based on Japanese Patent Application No. 2019-037270 filed on Mar. 1, 2019, the disclosure of which is incorporated herein by reference.

TECHNICAL FIELD

The present invention relates to a resistance change element and a method of manufacturing such.

BACKGROUND

Conventionally, in machine tools and the like, position detection devices have been used for detecting the position and movement amount (change amount) caused by rotational movement or linear movement of a moving body. As this kind of position detection device, one provided with a magnetic sensor capable of detecting change in an external magnetic field accompanying movement of the moving body has been known, and a signal indicating the relative positional relationship between the moving body and the magnetic sensor is output from the magnetic sensor.

As the magnetic sensor used in such a position detection device, one that is a laminated body having a magnetization free layer and a magnetization fixed layer and is provided with a resistance change element (for example, a GMR element, a TMR element or the like) having a resistance change film in which the resistance changes accompanying change in the magnetization direction of the magnetization free layer in accordance with an external magnetic field has been known. As this kind of resistance change element, one in which a hard-bias layer of a permanent magnet or the like is provided on the side surface of the resistance change film in order to make the initial magnetization direction of the magnetization free layer a prescribed direction (see Patent Literature 1) is known.

A resistance change element having a resistance change film in which the resistance changes in accordance with changes in the external environment is utilized in a variety of technical fields. For example, a resistance change element having a resistance change film in which the resistance changes in accordance with an applied voltage is used in nonvolatile memory (for example, Resistance Random Access Memory (ReRAM) or the like) for which major progress is anticipated in information portable terminals and the like. For example, a resistance change element that has a lower electrode and an upper electrode, a resistance change film interposed between these and an interlayer insulating film that covers the side surface of the resistance change film (see Patent Literature 2) is known. In addition, a thermistor that is a resistance change element having a resistance change film in which the resistance changes in accordance with the external temperature and that has a structure similar to the resistance change element in the above-described nonvolatile memory has been proposed.

RELATED LITERATURE

Patent Literature

[PATENT LITERATURE 1] JP Laid-Open Patent Application No. 2002-305336
[PATENT LITERATURE 2] JP Laid-Open Patent Application No. 2006-80259

OVERVIEW OF THE INVENTION

Problem to be Solved by the Invention

In the resistance change element mentioned in above-described Patent Literature 1, as shown in FIG. 7 a hard-bias layer 4' that is made of a conductive material is provided near the side surface of a resistance change layer 2' in which a magnetization fixed layer 21', a nonmagnetic layer 22' and a magnetization free layer 23' are layered in that order. The hard-bias layer 4' that generates a bias magnetic field for causing the magnetization direction of the magnetization free layer 23' to stabilize in a prescribed direction needs to be close to the side surface of the resistance change layer 2'. If the hard-bias layer 4' is close to the side surface of the resistance change layer 2', on the structure of the resistance change element 1', the bottom surface 41' of the hard-bias layer 4' and the top surface 311' of a lower lead electrode 31' inevitably become close to each other. In a resistance change element 1' having this kind of structure, the sense current that should pass through an upper lead electrode 32', the resistance change layer 2' and the lower lead electrode 31' in that order may flow as a tunnel current between the bottom surface 41' of the hard-bias layer 4' and the top surface 311' of the lower lead electrode 31'. When this kind of tunnel current flows, there is a problem that the properties of the resistance change element 1' deteriorate.

In addition, when the hard-bias layer 4' is not provided in the above-described resistance change element 1', as shown in FIG. 8, the thickness of an interlayer insulating film 5' becomes thin in the vicinity of the side surface of the resistance change layer 2', so that a tunnel current may flow in the same way as described above. That is, even in a resistance change element 1' having this kind of structure, there is a problem that the properties of the resistance change element 1' deteriorate.

Furthermore, in a resistance change element 1' used in nonvolatile memory or a thermistor, a tunnel current may flow in the same way as described above because the thickness of the interlayer insulating film 5' becomes thin in the vicinity of the side surface of the resistance change element 2' (see FIG. 9). As a result, there is a problem that the properties of the resistance change element 1' deteriorate.

In consideration of the foregoing, it is an object of the present invention to provide a resistance change element that can stably demonstrate desired properties, and a method of manufacturing such.

Means for Solving the Problem

To resolve the above-described problem, the present invention provides a resistance change element including a first lead electrode, a resistance change layer provided on the first lead electrode, and a second lead electrode provided on the resistance change layer. The surface of the first lead electrode on the resistance change layer side includes a first region, in which the resistance change layer is provided, and a second region, which is a region other than the first region. In the second region, a second material is unevenly distributed, and the second material has a work function that is larger than that of a first material that configures the first lead electrode.

An injection layer in which the second material is injected may be provided in the second region of the first lead electrode. The work function of the second material may be 4.8 eV or more. As the second material, platinum or iridium can be used.

The resistance change layer may be a magnetoresistance effect laminated body. The magnetoresistance effect laminated body may be a TMR laminated body or a GMR laminated body, and further include a bias magnetic field generator that is positioned to be interposed between the first lead electrode and the second lead electrode and in the vicinity of the side surface of the magnetoresistance effect laminated body.

In addition, the resistance change layer may be a metal oxide layer, may be a layer in which the resistance value is changed by the external temperature, and may be a layer in which the resistance value is changed by a voltage applied on the first lead electrode or the second lead electrode.

The present invention provides a method of manufacturing a resistance change element including a first lead electrode, a resistance change layer provided on the first lead electrode and a second lead electrode provided on the resistance change layer. The manufacturing method includes a procedure for forming the first lead electrode configured by a first material, a procedure for forming a resistance change film made of the material configuring the resistance change layer on the first lead electrode, a procedure for forming a resist pattern corresponding to the resistance change layer on the resistance change film, a procedure for forming the resistance change layer in a first region on the first lead electrode by milling the resistance change film using the resist pattern as a mask, a procedure for forming a second material film that is made of a second material having a larger work function than the first material into a second region that is the region other than the first region on the first lead electrode, a procedure for milling the second material film, and a procedure for forming the second lead electrode on the resistance change layer. In the procedure for milling the second material film, an ion beam is incident at an inclined angle with respect to the surface of the first lead electrode.

The incident angle of the ion beam with respect to the surface of the first lead electrode may be 5~45°.

Efficacy Of The Invention

With the present invention, it is possible to provide a resistance change element that can stably demonstrate desired properties, and a method of manufacturing such.

EMBODIMENT(S) OF THE INVENTION

Figure 1:
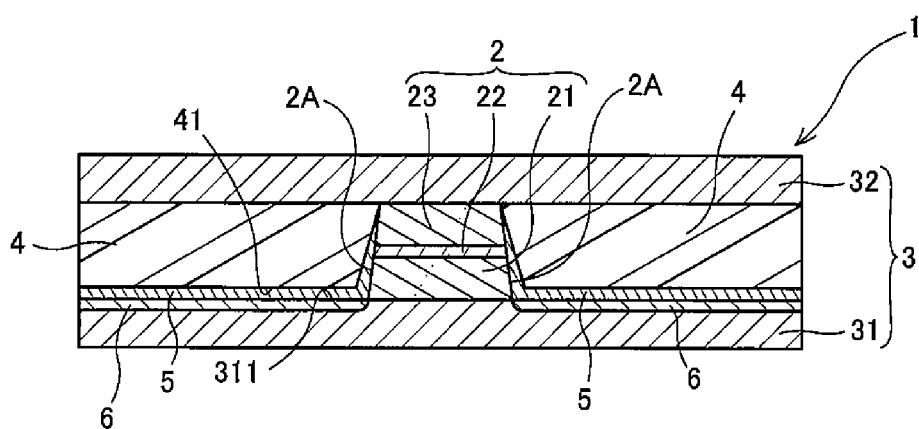
FIG. 1 is a cross-sectional view showing the schematic configuration of a magnetoresistive effect element that is one aspect of a resistance change element according to an embodiment of the present invention.

An embodiment of the present invention will be described with reference to the drawings. FIG. 1 is a cross-sectional view showing the schematic configuration of a magnetoresistive effect element that is one aspect of a resistance change element according to this embodiment, FIG. 2 is a cross-sectional view showing another example of the schematic configuration of a magnetoresistive effect element that is one aspect of the resistance change element according to this embodiment, FIG. 3 is a cross-sectional view showing the schematic configuration of a thermistor element and a nonvolatile memory element that is one aspect of the resistance change element according to this embodiment, and FIG. 4 is an perspective view showing the schematic configuration of a first lead electrode of the resistance change element according to this embodiment.

Figure 2:
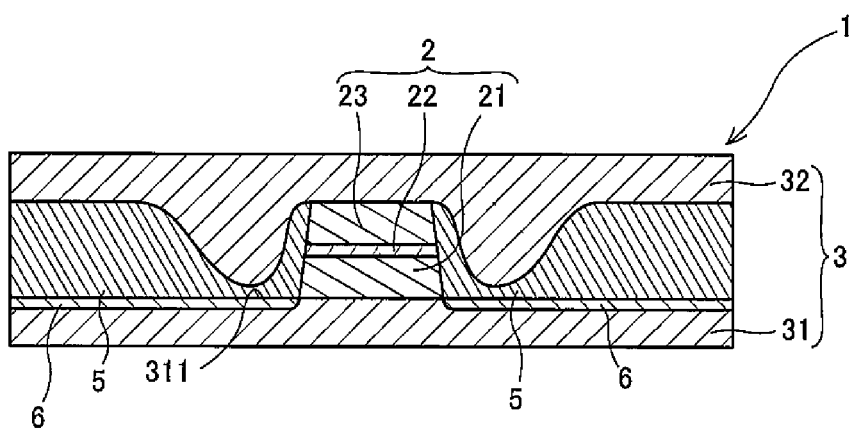
FIG. 2 is a cross-sectional view showing another example of the schematic configuration of a magnetoresistive effect element that is one aspect of the resistance change element according to an embodiment of the present invention.
Figure 3:
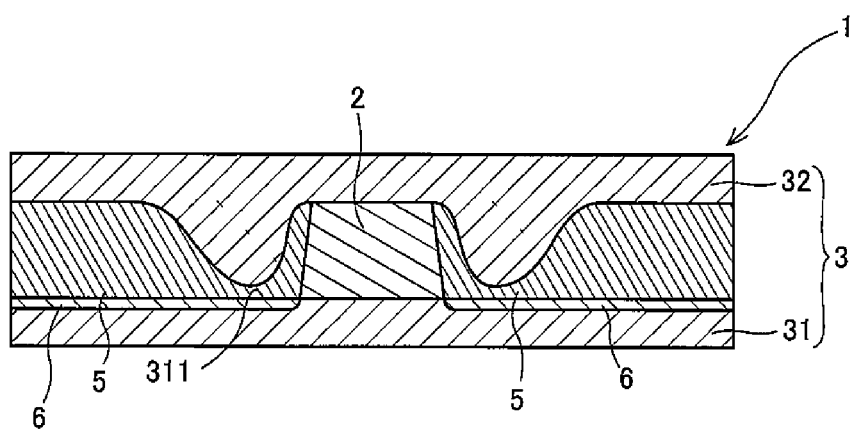
FIG. 3 is a cross-sectional view showing the schematic configuration of a thermistor element and a nonvolatile memory element that is one aspect of the resistance change element according to an embodiment of the present invention.
Figure 4:
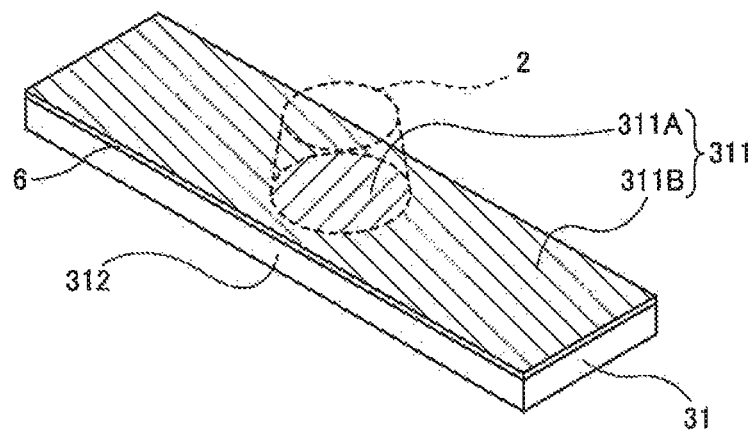
FIG. 4 is a perspective view showing the schematic configuration of a first lead electrode of the resistance change element according to an embodiment of the present invention.

As shown in FIG. 1 to FIG. 3, a resistance change element 1 according to this embodiment is provided with a resistance change layer 2, and a lead electrode 3 electrically connected to the resistance change layer 2 in series. The resistance change element 1 according to this embodiment is an element to be able to detect resistance value changes in the resistance change layer 2 caused by the external environment (external magnetic fields or external temperature) through a sense current being impressed along a direction perpendicular to the resistance change layer 2 (the upward direction or downward direction in FIG. 1 to FIG. 3), or to change the resistance value of the resistance change layer 2 by impressing the sense current (impressing a voltage). That is, the resistance change element 1 according to this embodiment can be applied to various types of products belonging to the spintronics field, such as a magnetic sensor, a magnetic head, Magnetoresistive Random Access Memory (MRAM), a spin torque diode, a spin torque oscillator and/or the like, or a memory device such as ReRAM or the like, or a Negative Temperature Coefficient (NTC) thermistor or the like.

Specifically, the resistance change element 1 includes a first lead electrode 31, the resistance change layer 2 and a second lead electrode 32. In the resistance change element (magnetoresistance effect element) 1 shown in FIG. 1 and FIG. 2, the resistance change layer 2 is a Tunnel Magnetoresistance element (TMR element), or a Giant Magnetoresistance element (GMR element), includes a magnetization fixed layer 21 in which the magnetization direction is fixed, a magnetization free layer 23 in which the magnetization direction changes in accordance with the direction of an impressed magnetic field, and a nonmagnetic layer 22 positioned between the magnetization fixed layer 21 and the magnetization free layer 23, and is a laminated body in which the magnetization fixed layer 21, the nonmagnetic layer 22 and the magnetization free layer 23 are layered in that order from the first lead electrode 31 side. Between the magnetization fixed layer 21 and the first lead electrode 31, an antiferromagnetic layer (omitted from the drawings) that is configured by an antiferromagnetic material including manganese and at least one type of element selected from the group consisting of platinum, ruthenium, rhodium, palladium, nickel, copper, iridium, chrome and iron (manganese content being around 35~95%), and serves the role of fixing the direction of magnetization of the magnetization fixed layer 21 through exchange coupling with the magnetization fixed layer 21 may be provided. In addition, there may also be a cap layer (protective layer) between the magnetization free layer 23 and the second lead electrode 32.

The magnetization fixed layer 23 is electrically connected to the second lead electrode 32, and the magnetization fixed layer 21 is electrically connected to the first lead electrode 31. As the material by which the magnetization free layer 23 and the magnetization fixed layer 21 are configured, for example, permalloy, cobalt iron, cobalt iron boron, cobalt iron nickel, cobalt manganese silicon alloy, cobalt manganese germanium alloy, iron oxide and the like can be cited. The thicknesses of the magnetization free layer 23 and the magnetization fixed layer 21 are approximately 1~10 nm each.

The nonmagnetic layer 22 is a tunnel barrier layer and is a layer that is required in order to realize the tunnel magnetoresistance effect (TMR effect) in the resistance change layer 2 in this embodiment. As the material by which the nonmagnetic layer 22 is configured, the following can be listed as examples: copper, gold, silver, zinc, gallium, titanium oxide, zinc oxide, indium oxide, tin oxide, gallium nitride, indium-tin oxide, aluminum oxide, magnesium oxide and the like. The nonmagnetic layer 22 may be configured by a laminated film with two or more layers. For example, the nonmagnetic layer 22 may be a three-layer laminated film of copper/zinc oxide/copper, or may be a three-layer laminated film of copper/zinc oxide/zinc in which the coppers is replaced with zinc. The thickness of the nonmagnetic layer 22 is approximately 0.1~5 nm.

In the resistance change layer 2 in this embodiment, the resistance value changes in accordance with the angle formed between the direction of magnetization of the magnetization free layer 23 and the direction of magnetization of the magnetization fixed layer 21. The resistance value is a minimum when this angle is 0° (when the two magnetization directions are parallel) and a maximum when this angle is 180° (when the two magnetization directions are antiparallel).

In the resistance change element (magnetoresistance effect element) 1 shown in FIG. 1, a bias magnetic field generator 4 is provided to be close to the side surface 2A of the resistance change layer 2. The magnetization direction of the magnetization free layer 23 can be stabilized by the bias magnetic field generated from the bias magnetic field generator 4 applied on the magnetization free layer 23. An interlayer insulating films 5 configured by aluminum oxide, silicon oxide or the like are provided in the gap between the bias magnetic field generator 4 and the side surface 2A of the resistance change layer 2, and the gap between the bias magnetic field generator 4 and the first lead electrode 31.

The bias magnetic field generator 4 may be a hard-bias layer (permanent magnet) or the like configured by a magnetic alloy such as cobalt-platinum, cobalt-chrome-platinum, cobalt-palladium-platinum or the like, for example, and is preferably configured by a magnetic alloy containing platinum. Since the bias magnetic field generator 4 is positioned in the vicinity of the side surface 2A of the resistance change layer 2, that is, in the gap between the first lead electrode 31 and the second lead electrode 32, consequently, the volume is limited. On the other hand, when the bias magnetic field generator 4 generates a bias magnetic field of the necessary magnetic field strength to stabilize the magnetization direction of the magnetization free layer 23, the bias magnetic field generator 4 comes close to the first lead electrode 31. The gap D between the bias magnetic field generator 4 and the first lead electrode 31 (first surface 311) is, for example, approximately 3~20 nm.

In the resistance change element 1 shown in FIG. 3, the resistance change layer 2 is configured by a metal oxide such as manganese oxide, nickel oxide, cobalt oxide, iron oxide, aluminum oxide, zirconium oxide, titanium oxide, copper oxide, zinc oxide, tantalum oxide, hafnium oxide, barium oxide, barium titanate or the like. When the resistance change element 1 shown in FIG. 3 is a thermistor element, the resistance change layer 2 is configured by a metal oxide such as manganese oxide, nickel oxide, cobalt oxide, iron oxide, aluminum oxide, zirconium oxide, titanium oxide, copper oxide, zinc oxide, barium oxide, barium titanate or the like, and the resistance value can be changed in accordance with the external temperature. On the other hand, when the resistance change element 1 shown in FIG. 3 is a nonvolatile memory element (for example, an element used in ReRAM), the resistance change layer 2 is configured by a metal oxide such as tantalum oxide, titanium oxide, hafnium oxide, nickel oxide, aluminum oxide or the like, and the resistance value can be changed by applying a voltage via the first lead electrode 31 or the second lead electrode 32.

In the resistance change element 1 shown in FIG. 2 and FIG. 3, the bias magnetic field generator 4 is not provided at the side surface 2A of the resistance change layer 2, unlike the resistance change element 1 shown in FIG. 1. In the procedures for manufacturing this type of resistance change element 1, as described below, after forming the resistance change layer 2 on a first region 311A of the first lead electrode 31, the interlayer insulating film 5 configured by aluminum oxide, silicon oxide or the like is formed on a second region 311B. At this time, the film thickness of the interlayer insulating film 5 becomes thin in the vicinity of the side surface 2A of the resistance change layer 2. Consequently, by forming the second lead electrode 32 on this interlayer insulating film 5, the second lead electrode 32 comes sectionally close to the first lead electrode 31, and the gap D between the first lead electrode 31 and the second lead electrode 32 in this section is approximately 3~20 nm, for example.

In the resistance change element 1 shown in FIG. 1 to FIG. 3, the first lead electrode 31 and the second lead electrode 32 may be configured by, for example, one type of electroconductive material (a first metal material) of copper, aluminum, gold, tantalum, titanium, ruthenium or the like or a laminated film of two or more types of electroconductive materials (the first metal material), but the second lead electrode 32 is preferably configured by an electroconductive material with a larger work function than the first metal material that configuring the first lead electrode 31 (for example, a second metal material that makes up a below-described injection layer 6). By configuring the second lead electrode 32 of the second metal material, even if the first lead electrode 31 and the second lead electrode 32 are close together (see FIG. 2 and FIG. 3 in particular) in the below-described second region 311B (see FIG. 4), it is possible to prevent a tunnel current from flowing through the interlayer insulating film 5 positioned between the two. The thicknesses of the first lead electrode 31 and the second lead electrode 32 are approximately 0.3~2.0 µm each. The first lead electrode 31 may be provided on a semiconductor substrate (omitted from drawings) with a base insulating film (omitted from drawings) made of aluminum oxide or the like interposed therebetween.

As shown in FIG. 4, the first lead electrode 31 is a plate-shaped body having a first surface 311 on which the resistance change layer 2 is provided and a second surface 312 opposite to the first surface 311. The first surface 311 of the first lead electrode 31 includes the first region 311A on which the resistance change layer 2 is provided and the second region 311B that is the region other than the first region 311A.

The second region 311B is injected with the second metal material having a larger work function than the work function of the first metal material configuring the first lead electrode 31, and is provided with an injection layer 6 in which the second metal material is unevenly distributed on the first surface 311 side. In the resistance change element 1 according to this embodiment, by providing the injection layer 6 in which the second metal material is unevenly distributed on the first surface 311 side in the second region 311B, even if the first lead electrode 31 and the second lead electrode 32 are close to each other, it is possible to prevent tunnel current from flowing through the interlayer insulating film 5 positioned in the gap in between these.

Figure 5:
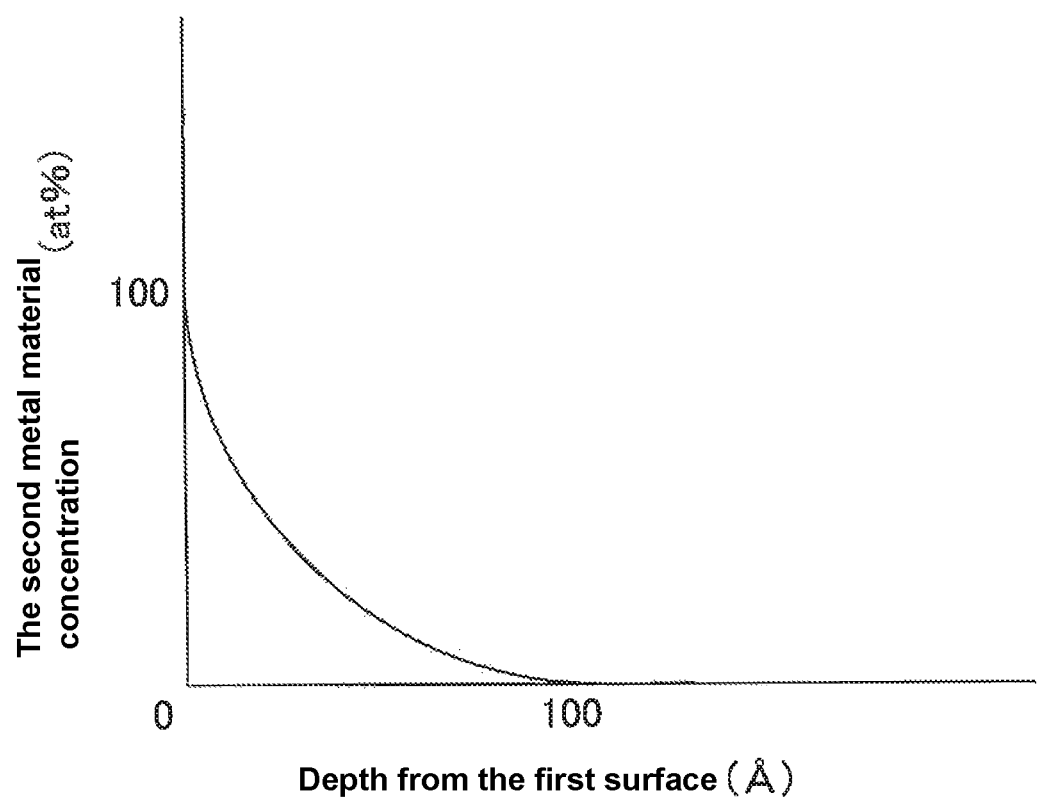
FIG. 5 is a graph showing the concentration profile of a second metal material in the injection layer injected into the first lead electrode of the resistance change element according to an embodiment of the present invention.
Figure 6A:
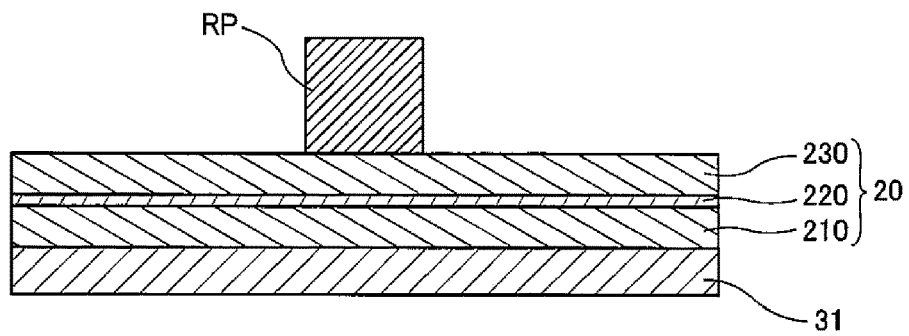
FIG. 6A is a procedure flow diagram showing in a cross-sectional view of each process of a method of manufacturing the resistance change element according to the present invention.
Figure 6B:
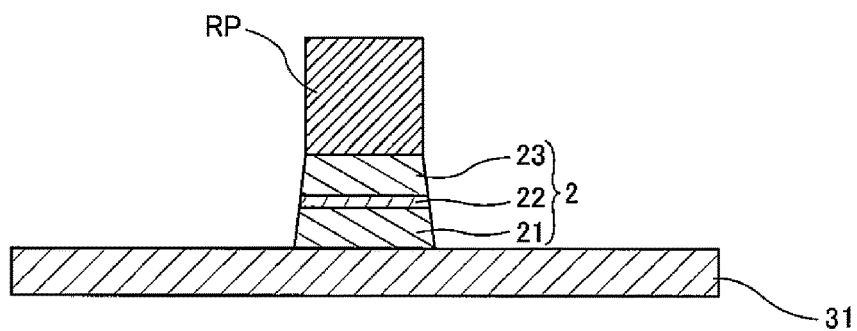
FIG. 6B is a procedure flow diagram showing in a cross-sectional view of each process of a method of manufacturing the resistance change element according to the present invention.
Figure 6C:
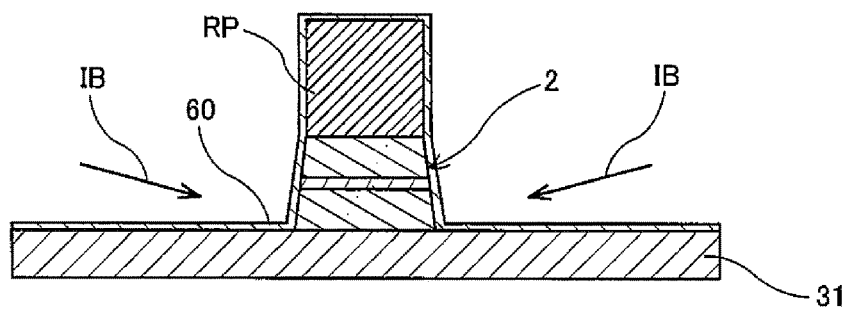
FIG. 6C is a procedure flow diagram showing in a cross-sectional view of each process of a method of manufacturing the resistance change element according to the present invention.
Figure 6D:
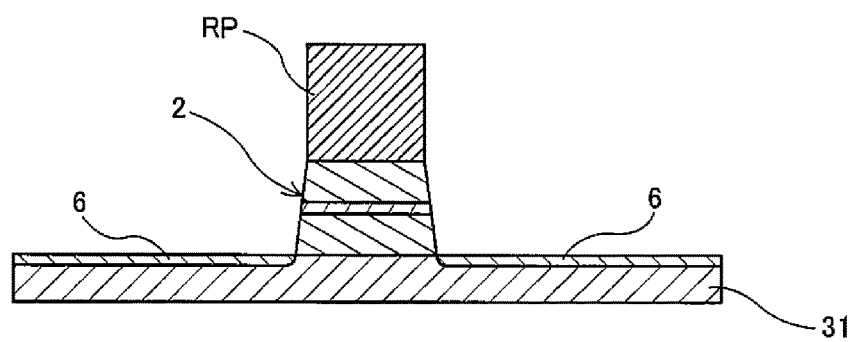
FIG. 6D is a procedure flow diagram showing in a cross-sectional view each process of a method of manufacturing the resistance change element according to the present invention.
Figure 7:
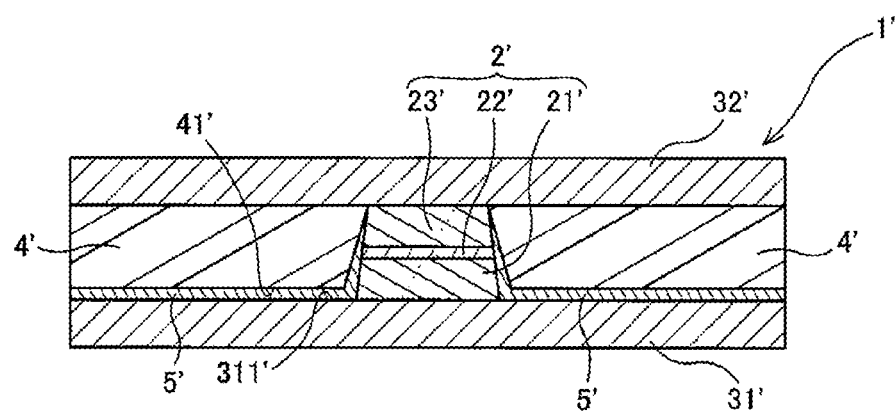
FIG. 7 is a cross-sectional view showing the schematic configuration of a magnetoresistive effect element that is one aspect of a conventional resistance change element.
Figure 8:
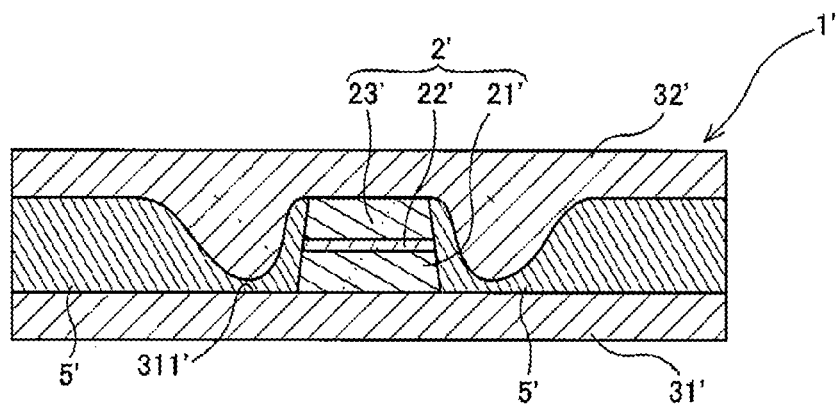
FIG. 8 is a cross-sectional view showing another schematic configuration of a magnetoresistive effect element that is one aspect of a conventional resistance change element.
Figure 9:
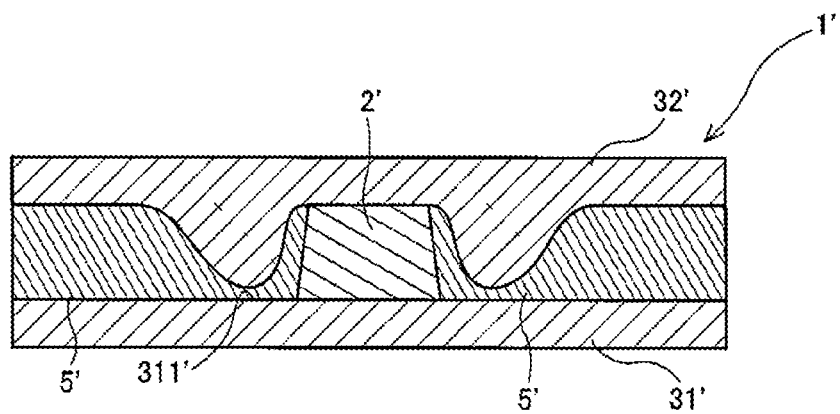
FIG. 9 is a cross-sectional view showing the schematic configuration of a thermistor element and a nonvolatile memory element that are one aspect of a conventional resistance change element.

The second metal material being unevenly distributed in the first surface 311 side of the first lead electrode 31 means that, as shown in FIG. 5, a concentration gradient exists such that the concentration of the second metal material becomes thinner moving from the first surface 311 side toward the second surface 312 side in the direction of thickness of the first lead electrode 31. By having the work function determined by the element ratio of the metal material in the surface of the first surface 311 of the first lead electrode 31 be relatively large, it is possible to prevent tunnel current from flowing through the interlayer insulating film 5 positioned between the first lead electrode 31 and the second lead electrode 32. In this embodiment, by having the second metal material unevenly distributed on the first surface 311 side of the second region 311B of the first lead electrode 31, the element ratio of the second metal material at the surface of the first surface 311 of the first lead electrode 31 can be increased, and the work function at that surface can be relatively increased, and consequently it is possible to prevent the above-described tunnel current from flowing.

The work function of the second metal material should be larger than the work function of the first metal material, and preferably is 4.8 eV or greater, and particularly preferably is 5.0 eV or greater. By having the work function of the second metal material be 4.8 eV or greater, it is possible to control discharge of electrons from the first lead electrode 31, and it is possible to prevent tunnel current from flowing through the interlayer insulating film 5 positioned in the gap between the first lead electrode 31 and the second lead electrode 32.

The second metal material may, for example, be platinum, which has a work function of 5.65 eV, or iridium, which has a work function of 5.27 eV, or the like. By using such materials as the second metal material, it is possible to prevent sense current from flowing through the interlayer insulating film 5 positioned in the gap between the first lead electrode 31 and the second lead electrode 32.

A method of manufacturing the resistance change element 1 having the above-described configuration will be described.

FIGS. 6A~6D are procedure flow diagrams showing in cross-sectional views of manufacturing procedures for the resistance change element 1 according to this embodiment. FIGS. 6A~6D illustrate a method of manufacturing the resistance change element 1 having the resistance change layer 2 shown in FIG. 1 and FIG. 2, but the resistance change element 1 having the resistance change layer 2 shown in FIG. 3 can also be manufactured with the same procedures.

The first lead electrode 31 configured by the first metal material is formed on a base insulating film such as aluminum oxide or the like formed on a semiconductor substrate. Next, a resistance change film 20 (for example, a laminated film or the like in which a ferromagnetic film 210, a nonmagnetic film 220 and a ferromagnetic film 230 are layered in this order) is formed through sputtering or the like to cover the first lead electrode 31, and a resist pattern RP corresponding to the resistance change layer 2 is formed on the resistance change film 20 (see FIG. 6A). Furthermore, after a milling process using the resist pattern RP as a mask, the resistance change layer 2 is formed on the first region 311A of the first lead electrode 31 (see FIG. 6B).

Next, a second metal material film 60 is formed through sputtering or the like to cover the second region 311B of the first lead electrode 31, the side surface 2A of the resistance change layer 2 and the resist pattern RP. Following this, an ion beam IB is incident at an inclined angle on the first surface 311 of the first lead electrode 31 and removes the second metal material film 60 on the side surface 2A of the resistance change layer 2 (see FIG. 6C). At this time, by having the incident angle of the ion beam be 5~45° with respect to the first surface 311, the second metal material film 60 on the side surface 2A of the resistance change layer 2 can be removed and the second metal material configuring the second metal material film 60 on the second region 311B can be injected into the second region 311B of the first lead electrode 31. Through this, it is possible to form the injection layer 6 in which the second metal material is distributed unevenly (exists in high concentration) in the surface of the second region 311B (see FIG. 6D).

Next, the interlayer insulating film 5 such as aluminum oxide or the like is formed on the second region 311B of the first lead electrode 31, and after the bias magnetic field generator 4 is formed as desired, the second lead electrode 32 that is electrically connected to the resistance change film 2 is formed. In this manner, the resistance change element 1 (see FIGS. 1~3) according to this embodiment can be manufactured. In this embodiment, the film thickness of the interlayer insulating film 5 formed on the second region 311 becomes thin (see FIGS. 1~3), but since the injection layer is formed in the second region 311, it becomes possible to prevent tunnel current from flowing between the first lead electrode 31 and the bias magnetic field generator 4 or the second lead electrode 32.

As discussed above, with the resistance change element 1 according to this embodiment, by having the second metal material distributed unevenly in the first surface 311 side of the second region 311B of the first lead electrode 31, the element ratio of the second metal material at the surface of the first surface 311 of the first lead electrode 31 can be increased and the work function at this surface can be relatively increased, so it is possible to prevent sense current flowing through the interlayer insulating film 5 positioned in the gap between the first lead electrode 31 and the second lead electrode 32. Consequently, in the resistance change element 1 according to this embodiment, the desired properties can be stably demonstrated. Hence, with a magnetic sensor or the like using the resistance change element 1 according to this embodiment, it is possible to detect the physical quantity (for example, the rotational angle or the like) that is the target of detection in the magnetic sensor with high accuracy. In addition, with a thermistor or the like using the resistance change element 1 according to this embodiment, highly accurate temperature detection becomes possible. Furthermore, with a memory device such as ReRAM and/or the like using the resistance change element 1 according to this embodiment, information can be recorded and read reliably.

The embodiment described above was described to facilitate understanding of the present invention and is not described for limiting the present invention. Accordingly, each element disclosed in the above-described embodiment shall include all design alterations and equivalents falling within the technical scope of the present invention.

DESCRIPTION OF SYMBOLS

1 Resistance change element
2 Resistance change layer
3 Lead electrode
31 First lead electrode
32 Second lead electrode

The invention claimed is:

1. A resistance change element comprising:
a first lead electrode;
a resistance change layer provided on the first lead electrode; and
a second lead electrode provided on the resistance change layer;
wherein the first lead electrode is a plate-shaped body having a first surface and a second surface, which is opposite to the first surface,
the first surface of the first lead electrode is a flat surface and is divided into a first region and a second region,
the resistance change layer is provided on the first region of the first lead electrode,
an injection layer is presented in the first lead electrode to be exposed to the first surface in the second region,
in the injection layer, the second material is unevenly distributed on the first surface side in the second region, and
the second material has a work function that is larger than that of a first material that configures the first lead electrode.

2. The resistance change element according to claim 1, wherein the work function of the second material is 4.8 eV or more.

3. The resistance change element according to claim 1, wherein the second material is platinum or iridium.

4. The resistance change element according to claim 1, wherein the resistance change layer is a magnetoresistance effect laminated body.

5. The resistance change element according to claim 4, wherein the magnetoresistance effect laminated body is a TMR laminated body or a GMR laminated body.

6. The resistance change element according to claim 4, further comprising a bias magnetic field generator that is positioned to be interposed between the first lead electrode and the second lead electrode and in the vicinity of the side surface of the magnetoresistance effect laminated body.

7. The resistance change element according to claim 1, wherein the resistance change layer is a metal oxide layer.

8. The resistance change element according to claim 7, wherein the resistance change layer is a layer in which the resistance value is changed by the external temperature.

9. The resistance change element according to claim 7, wherein the resistance change layer is a layer in which the resistance value is changed by a voltage applied on the first lead electrode or the second lead electrode.

10. A method of manufacturing a resistance change element according to claim 1, the manufacturing method including:
a procedure for forming the first lead electrode configured by a first material;
a procedure for forming a resistance change film made of the material configuring the resistance change layer, on the first lead electrode;
a procedure for forming a resist pattern corresponding to the resistance change layer on the resistance change film;
a procedure for forming the resistance change layer in a first region on the first lead electrode by milling the resistance change film using the resist pattern as a mask;
a procedure for forming a second material film that is made of a second material having a larger work function than the first material into a second region that is the region other than the first region on the first lead electrode;
a procedure for milling the second material film; and
a procedure for forming the second lead electrode on the resistance change layer;
wherein in the procedure for milling the second material film, an ion beam is incident at an inclined angle with respect to the surface of the first lead electrode.

11. The method of manufacturing a resistance change element according to claim 10, wherein the incident angle of the ion beam with respect to the surface of the first lead electrode is 5~45°.

12. The resistance change element according to claim 1, wherein the first lead electrode has a concentration gradient such that the concentration of the second material becomes thinner moving from the first side toward the second surface side in a direction of thickness of the first lead electrode.

* * * * *